US010720479B2

(12) United States Patent
Song et al.

(10) Patent No.: US 10,720,479 B2
(45) Date of Patent: Jul. 21, 2020

(54) DISPLAY SUBSTRATE, METHOD FOR FABRICATING THE SAME, AND DISPLAY DEVICE

(71) Applicant: BOE Technology Group Co., Ltd., Beijing (CN)

(72) Inventors: Zhen Song, Beijing (CN); Guoying Wang, Beijing (CN); Jiangbo Chen, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 16/429,265

(22) Filed: Jun. 3, 2019

(65) Prior Publication Data
US 2020/0044000 A1  Feb. 6, 2020

(30) Foreign Application Priority Data

Aug. 2, 2018 (CN) .......................... 2018 1 0872249

(51) Int. Cl.
*H01L 27/32* (2006.01)
*H01L 27/12* (2006.01)
*H01L 51/52* (2006.01)

(52) U.S. Cl.
CPC ........ *H01L 27/3246* (2013.01); *H01L 27/124* (2013.01); *H01L 27/322* (2013.01); *H01L 51/5206* (2013.01); *H01L 51/5221* (2013.01)

(58) Field of Classification Search
CPC . H01L 27/3246; H01L 27/124; H01L 27/322; H01L 51/5206; H01L 51/5221; H01L 27/3272; H01L 27/3269; H01L 27/1214; H01L 29/78633; H01L 27/3227; H01L 27/3262; H01L 51/56
See application file for complete search history.

(56) References Cited

U.S. PATENT DOCUMENTS

2017/0033171 A1* 2/2017 Kim .................... H01L 27/3262
2017/0062542 A1* 3/2017 Jung ................... H01L 27/3272

* cited by examiner

*Primary Examiner* — Abhishek Sarma
(74) *Attorney, Agent, or Firm* — Arent Fox LLP; Michael Fainberg

(57) ABSTRACT

The disclosure discloses a display substrate, a method for fabricating the same, and a display device. The display substrate includes: a light-shielding metal layer pattern on a base substrate; a photo-sensitive sensing element layer on the light-shielding metal layer pattern, wherein an orthographic projection of the photo-sensitive sensing element layer onto the base substrate lies in an overlapping area of orthographic projections of the light-shielding metal layer pattern and the sub-pixel areas onto the base substrate; a buffer layer on the photo-sensitive sensing element layer; and a compensation control TFT and a signal line on the buffer layer, wherein a source electrode of the compensation control TFT is electrically connected with the light-shielding metal layer pattern, and the signal line is electrically connected with the photo-sensitive sensing element layer.

20 Claims, 3 Drawing Sheets

DISPLAY SUBSTRATE, METHOD FOR FABRICATING THE SAME, AND DISPLAY DEVICE

CROSS-REFERENCE TO RELATED APPLICATION

This Application claims priority to Chinese Patent Application No. 201810872249.X, filed on Aug. 2, 2018, the content of which is incorporated by reference in the entirety.

FIELD

This disclosure relates to the field of display technologies, and particularly to a display substrate, a method for fabricating the same, and a display device.

DESCRIPTION OF THE RELATED ART

An Organic Light-Emitting Diode (OLED) display device has been widely applied due to its own characteristics, and in the related art, the uniformity and brightness of an image displayed on the OLED display device is generally electrically compensated for through internal or external compensation or their combination, but only display Mura arising from a change in Thin Film Transistor (TFT) threshold voltage and mobility can be electrically compensated, and a change in brightness of an OLED element arising from aging thereof cannot be dealt with. Although a panel can be optically compensated for as a whole before it is shipped from a factory, Mura arising as the Electroluminescence (EL) efficiency is dropping cannot be addressed.

SUMMARY

Embodiments of the disclosure provide a display substrate, a method for fabricating the same, and a display device.

In an aspect, the embodiments of the disclosure provide a display substrate, including a plurality of sub-pixel areas, wherein the display substrate further includes: a light-shielding metal layer pattern on a base substrate, wherein an orthographic projection of the light-shielding metal layer pattern onto the base substrate partially overlaps with orthographic projections of the plurality of sub-pixel areas onto the base substrate; a photo-sensitive sensing element layer on the light-shielding metal layer pattern, wherein an orthographic projection of the photo-sensitive sensing element layer onto the base substrate lies in an overlapping area of orthographic projections of the light-shielding metal layer pattern and the plurality of sub-pixel areas onto the base substrate; a buffer layer on the photo-sensitive sensing element layer; and a compensation control Thin Film Transistor (TFT) and a signal line on the buffer layer, wherein a source electrode of the compensation control TFT is electrically connected with the light-shielding metal layer pattern, and the signal line is electrically connected with the photo-sensitive sensing element layer.

In some embodiments, the photo-sensitive sensing element layer includes an N-type semiconductor layer, an intrinsic semiconductor layer, and a P-type semiconductor layer on the light-shielding metal layer pattern in that order, wherein the P-type semiconductor layer is electrically connected with the signal line.

In some embodiments, the display substrate further includes: an Indium Tin Oxide (ITO) layer between the photo-sensitive sensing element layer and the signal line, wherein the photo-sensitive sensing element layer is electrically connected with the signal line through the ITO layer.

In some embodiments, the orthographic projection of the compensation control TFT onto the base substrate overlaps with a part of the orthographic projection of the light-shielding metal layer pattern onto the base substrate.

In some embodiments, the compensation control TFT includes: an active layer, a gate insulation layer, a gate layer, and source and drain electrodes on the buffer layer in that order; wherein the display substrate further includes: an interlayer dielectric layer on the gate layer; wherein the source and drain electrodes, and the signal line are on the interlayer dielectric layer.

In some embodiments, the buffer layer includes: a first via-hole for connecting the source electrode with the light-shielding metal layer pattern, and a second via-hole for connecting the signal line with the photo-sensitive sensing element layer; the interlayer dielectric layer includes: a third via-hole corresponding to the first via-hole, and a fourth via-hole corresponding to the second via-hole; wherein the source electrode is electrically connected with the light-shielding metal layer pattern through the first via-hole and the third via-hole, and the signal line is electrically connected with the photo-sensitive sensing element layer through the second via-hole and the fourth via-hole.

In some embodiments, the display substrate further includes: a passivation layer on the compensation control TFT and the signal line; and a color filter layer on the passivation layer; wherein the color filter layer includes a plurality of sub-pixel layers corresponding to the plurality of sub-pixel areas in a one-to-one manner.

In some embodiments, the display substrate further includes: a black matrix on the passivation layer; wherein the black matrix covers the compensation control TFT in a direction perpendicular to the base substrate; an insulation medium layer on the color filter layer; and a secondary cathode, a spacer layer, and a transparent cathode layer on the insulation medium layer in that order.

In some embodiments, the display substrate further includes: an insulation medium layer on the color filter layer; and a transparent anode layer, a pixel definition layer, an electroluminescent layer, and a metal cathode layer on the insulation medium layer in that order; wherein the pixel definition layer is configured to define the plurality of sub-pixel areas.

In another aspect, the embodiments of the disclosure further provide a display device, including the display substrate according to the embodiments of the disclosure.

In a further aspect, the embodiments of the disclosure further provide a method for fabricating a display substrate including a plurality of sub-pixel areas, wherein the method includes: forming a metal layer on a base substrate, and patterning the metal layer to form a light-shielding metal layer pattern, wherein an orthographic projection of the light-shielding metal layer pattern onto the base substrate partially overlaps with orthographic projections of the plurality of sub-pixel areas onto the base substrate; forming a photo-sensitive sensing element layer on the light-shielding metal layer pattern, wherein an orthographic projections of the photo-sensitive sensing element layer onto the base substrate lies in an overlapping area of orthographic projections of the light-shielding metal layer pattern, and the plurality of sub-pixel areas onto the base substrate; forming a buffer layer on the photo-sensitive sensing element layer; forming a compensation control Thin Film Transistor (TFT) and a signal line on the buffer layer, wherein a source electrode of the compensation control TFT is electrically connected with the light-shielding metal layer pattern, and the signal line is electrically connected with the photo-sensitive sensing element layer.

In some embodiments, the photo-sensitive sensing element layer includes an N-type semiconductor layer, an intrinsic semiconductor layer, and a P-type semiconductor layer on the light-shielding metal layer pattern in that order, wherein the P-type semiconductor layer is electrically connected with the signal line.

In some embodiments, the method further includes: forming an Indium Tin Oxide (ITO) layer between the photo-sensitive sensing element layer and the signal line, wherein the photo-sensitive sensing element layer is electrically connected with the signal line through the ITO layer.

In some embodiments, forming the ITO layer between the photo-sensitive sensing element layer and the signal line includes: forming the ITO layer on the P-type semiconductor layer, after the P-type semiconductor layer in the photo-sensitive sensing element layer is formed, and before the buffer layer is formed.

In some embodiments, the orthographic projection of the compensation control TFT onto the base substrate overlaps with a part of the orthographic projection of the light-shielding metal layer pattern onto the base substrate.

In some embodiments, forming the compensation control TFT and the signal line on the buffer layer includes: forming an active layer on the buffers layer; forming a gate insulation layer on the active layer; forming a gate layer on the gate insulation layer; forming an interlayer dielectric layer on the gate layer; depositing a source-drain metal on the interlayer dielectric layer, and patterning the source-drain metal to form source and drain electrodes, and the signal line.

In some embodiments, the buffer layer includes: a first via-hole for connecting the source electrode with the light-shielding metal layer pattern, and a second via-hole for connecting the signal line with the photo-sensitive sensing element layer; the interlayer dielectric layer includes: a third via-hole corresponding to the first via-hole, and a fourth via-hole corresponding to the second via-hole; wherein the source electrode is electrically connected with the light-shielding metal layer pattern through the first via-hole and the third via-hole, and the signal line is electrically connected with the photo-sensitive sensing element layer through the second via-hole and the fourth via-hole.

In some embodiments, the method further includes: forming a passivation layer on the compensation control TFT and the signal line; and forming a color filter layer on the passivation layer; wherein the color filter layer includes a plurality of sub-pixel layers corresponding to the plurality of sub-pixel areas in a one-to-one manner.

In some embodiments, the method further includes: forming a black matrix on the passivation layer, after the passivation layer is formed, and before the color filter layer is formed on the passivation layer, wherein the black matrix covers the compensation control TFT in a direction perpendicular to the base substrate; forming an insulation medium layer on the color filter layer, after the color filter layer is formed; forming a secondary cathode on the insulation medium layer; forming a spacer layer on the secondary cathode; and forming a transparent cathode layer on the spacer layer.

In some embodiments, the method further includes: forming an insulation medium layer on the color filter layer; forming a transparent anode layer on the insulation medium layer; forming a pixel definition layer on the transparent anode layer to define the plurality of sub-pixel areas; forming an electroluminescent layer on the pixel definition layer; and forming a metal cathode layer on the electroluminescent layer.

BRIEF DESCRIPTION OF THE DRAWINGS

In order to make the technical solutions according to the embodiments of the disclosure more apparent, the drawings to which a description of the embodiments refers will be briefly introduced below, and apparently the drawings to be described below are merely illustrative of some of the embodiments of the disclosure, and those ordinarily skilled in the art can derive from these drawings other drawings without any inventive effort.

DETAILED DESCRIPTION OF THE EMBODIMENTS

Figure 1:
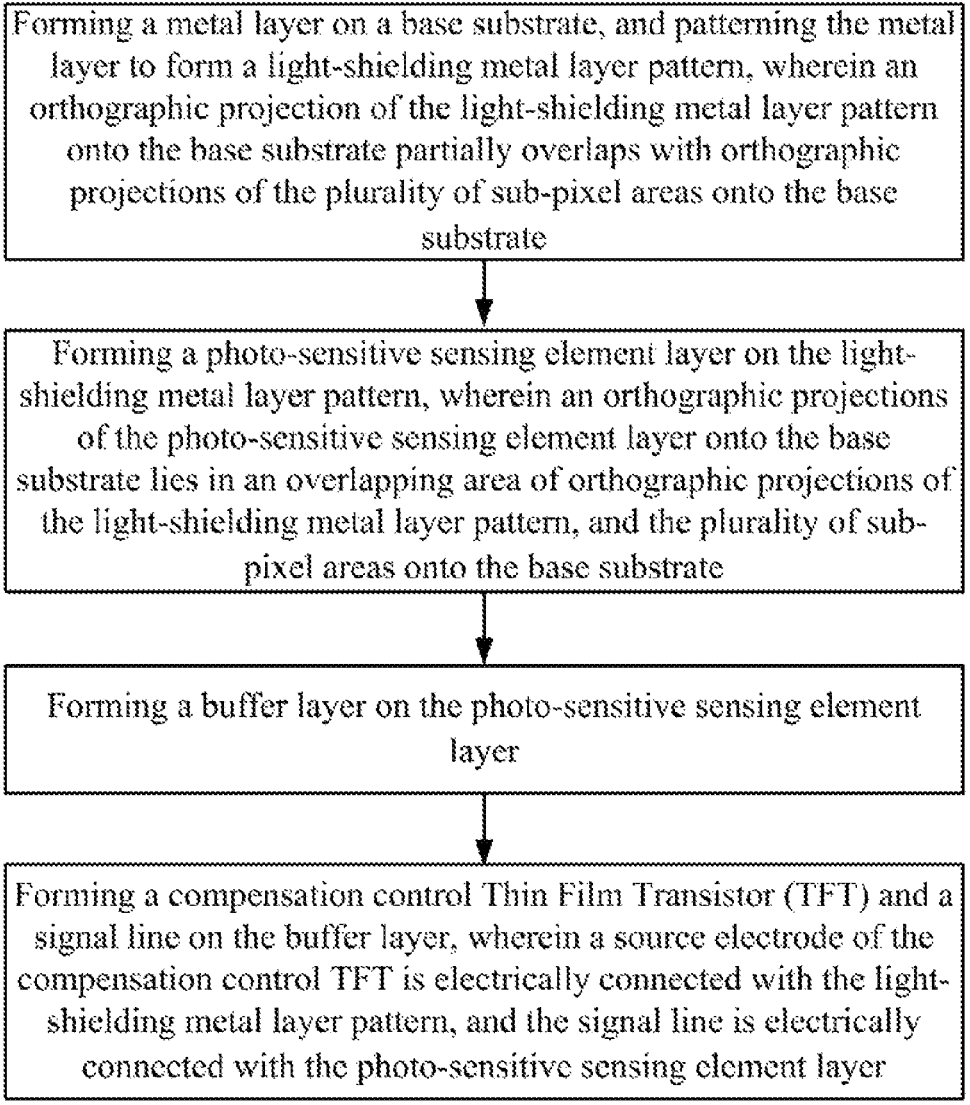
FIG. 1 is a schematic flow chart of a method for fabricating a display substrate according to the embodiments of the disclosure.
Figure 2:
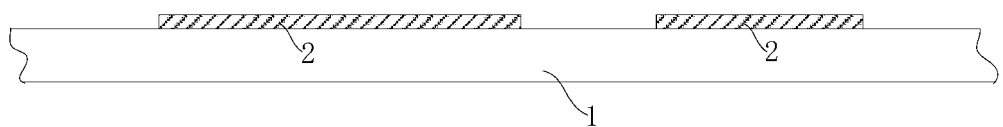
FIG. 2 to FIG. 6 are schematic structural diagrams of layers in the display substrate after respective operations in the fabricating method according to the embodiments of the disclosure.

The technical solutions according to the embodiments of the disclosure will be described below clearly and fully with reference to the drawings in the embodiments of the disclosure, and apparently the embodiments to be described are only a part but not all of the embodiments of the disclosure. Based upon the embodiments here of the disclosure, all the other embodiments which can occur to those ordinarily skilled in the art without any inventive effort shall fall into the claimed scope of the disclosure.

Referring to FIG. 1, and FIG. 2 to FIG. 6, the embodiments of the disclosure provide a method for fabricating a display substrate including a plurality of sub-pixel areas, where the method includes: forming a metal layer on a base substrate 1, and patterning the metal layer to form a light-shielding metal layer pattern 2, where an orthographic projection of the light-shielding metal layer pattern 2 onto the base substrate 1 partially overlaps with orthographic projections of the sub-pixel areas onto the base substrate 1; forming a photo-sensitive sensing element layer 3 on the light-shielding metal layer pattern 2, where an orthographic projection of the photo-sensitive sensing element layer 3 onto the base substrate 1 lies in an overlapping area of the orthographic projections of the light-shielding metal layer pattern 2 and the sub-pixel areas onto the base substrate 1; forming a buffer layer 4 on the photo-sensitive sensing element layer 3; forming a compensation control Thin Film Transistor (TFT) 5 and a signal line 6 on the buffer layer 4, where a source electrode of the compensation control TFT 5 is electrically connected with the light-shielding metal layer pattern 2, and the signal line 6 is electrically connected with the photo-sensitive sensing element layer 3.

In the method above for fabricating the display substrate, as illustrated in FIG. 1, and FIG. 2 to FIG. 6, the light-shielding metal layer pattern for shielding light is formed on the base substrate 1, where an orthographic projection of a part of the light-shielding metal layer pattern 2 overlaps with the orthographic projections of the sub-pixel areas, that is, a part of the light-shielding metal layer pattern 2 corresponds to the sub-pixel areas; the photo-sensitive sensing element layer 3 is formed in the part of the light-shielding metal layer pattern 2 corresponding to the sub-pixel areas, where a photo-sensitive sensing element is formed on the light-shielding metal layer pattern 2, so that the light-shielding metal layer pattern 2 can protect the photo-sensitive sensing element layer 3 to some extent to thereby avoid the photo-sensitive sensing element from being affected by the ambient light which is not emitted by the sub-pixels, so as to improve the photosensitivity of the photo-sensitive sensing element, thus improving the precision of optical compensation; and thereafter the buffer layer 4 is formed on the photo-sensitive sensing element layer 3, and next the compensation control TFT 5 and the signal line 6 are formed on the buffer layer 4, where the source electrode of the compensation control TFT 5 is electrically connected with the light-shielding metal layer pattern 2. Since the photo-sensitive sensing element layer 3 is arranged on the light-shielding metal layer pattern 2, the source electrode of the compensation control TFT 5 is electrically connected with the photo-sensitive sensing element layer 3, and the photo-sensitive sensing element layer 3 is further electrically connected with the signal line 6, which can provide low voltage, e.g., −5V. In this fabricating method, the photo-sensitive sensing element layer 3 is formed at positions corresponding to the sub-pixel areas, and the compensation control TFT 5 electrically connected with the photo-sensitive sensing element layer 3 is arranged, so the photo-sensitive sensing element can sense light in the sub-pixel areas to thereby detect in real time a change in brightness in each sub-pixel area so as to optically compensate for the display substrate in real time, thus alleviating effectively a display defect arising from a change in brightness of the organic light-emitting device; and in this fabrication method, the process of forming the photo-sensitive sensing element layer 3 is before the process of forming the compensation control TFT 5, that is, the compensation control TFT 5 is formed after firstly the photo-sensitive sensing element layer 3 is formed and then the buffer layer 4 is formed on the photo-sensitive sensing element layer, so the photo-sensitive sensing element layer 3 can be protected by the buffer layer 4 formed thereon so that a side wall of the photo-sensitive sensing element layer 3 will not be damaged in an etching process of subsequently forming the compensation control TFT 5. Further, since the photo-sensitive sensing element layer 3 is isolated from the compensation control TFT 5 by the buffer layer 4, the compensation control TFT 5 can be formed without being affected by hydrogen introduced while the photo-sensitive sensing element layer 3 is being formed, to thereby improve the reliability of the display substrate.

Accordingly, in the method above for fabricating the display substrate, the photo-sensitive sensing element and the compensation control TFT 5 are formed in the display substrate so that the display substrate can be optically compensated in real time to thereby alleviate effectively a display defect arising from a change in brightness of the organic light-emitting device; and in the fabrication process, firstly the photo-sensitive sensing element layer 3 and then compensation control TFT 5 are formed, and buffer layer 4 is formed between them, so the compensation control TFT 5 can be formed in the etching process without damaging the sidewall of the photo-sensitive sensing element layer 3, and the compensation control TFT 5 can be formed without being affected by hydrogen ions introduced while the photo-sensitive sensing element layer 3 is being formed.

In some embodiments, in the display substrate above, the photo-sensitive sensing element layer 3 includes an N-type semiconductor layer, an intrinsic semiconductor layer, and a P-type semiconductor layer on the light-shielding metal layer pattern 2 in that order, where the P-type semiconductor layer is electrically connected with the signal line 6. The N-type semiconductor layer is arranged on the light-shielding metal layer pattern 2, and the light-shielding metal layer pattern 2 is electrically connected with the compensation control TFT 5, so the light-shielding metal layer pattern 2 can act as an N-terminal electrode, of the photo-sensitive sensing element layer 3, which is electrically connected with the compensation control TFT 5, and the P-type semiconductor layer can act as a P-terminal electrode, of the photo-sensitive sensing element layer 3, which is electrically connected with the signal line 6.

Figure 6:
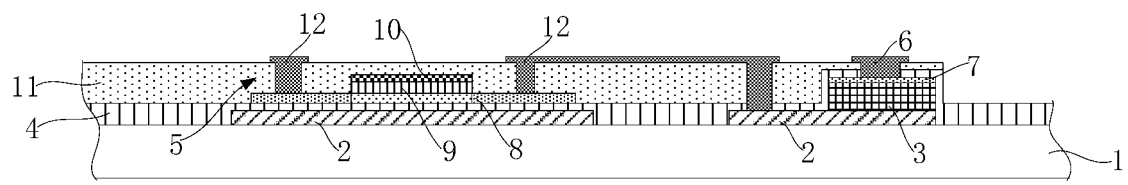

In some embodiments, as illustrated in FIG. 6, the orthographic projection of the compensation control TFT 5 onto the base substrate 1 overlaps with a part of the orthographic projection of the light-shielding metal layer pattern 2 onto the base substrate 1. A part of the light-shielding metal layer pattern 2 corresponds to the compensation control TFT 5, and the part of the light-shielding metal layer pattern 2 corresponding to the compensation control TFT 5 can shield light from being incident on the compensation control TFT 5 to thereby protect the compensation control TFT 5 to some extent from being affected by the light rays, so as to improve the stability of the compensation control TFT 5.

Figure 4:
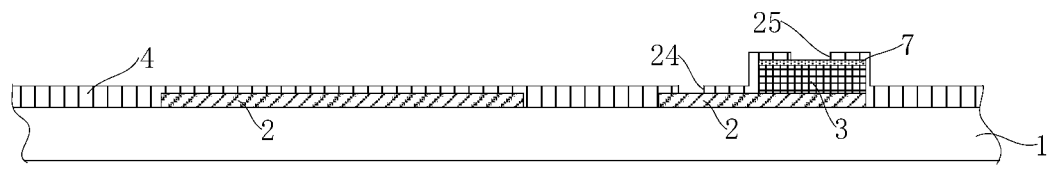
Figure 5:
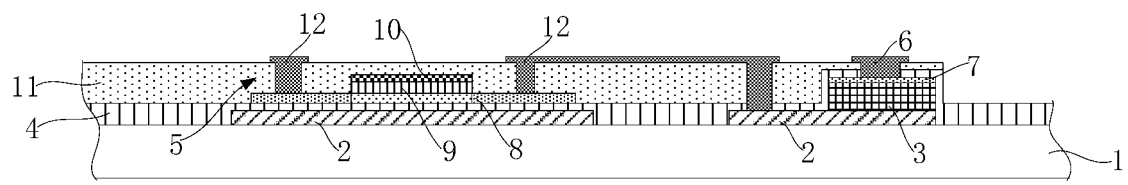

As illustrated in FIG. 4 and FIG. 5, in the method above for fabricating the display substrate, forming the compensation control TFT 5 and the signal line 6 on the buffer layer 4 includes: forming an active layer 8 on the buffer layer 4; forming a gate insulation layer 9 on the active layer 8; forming a gate layer 10 on the gate insulation layer 9; forming an interlayer dielectric layer 11 on the gate layer 10; depositing a source-drain metal on the interlayer dielectric layer 11, and patterning the source-drain metal to form source and drain electrodes 12 and the signal line 6; where a first via-hole 24 for connecting the source electrode with the light-shielding metal layer pattern 2, and a second via-hole 25 for connecting the signal line 6 with the photo-sensitive sensing element layer 3 are formed on the buffer layer 4, a third via-hole corresponding to the first via-hole 24, and a fourth via-hole corresponding to the second via-hole 25 are formed on the interlayer dielectric layer; the source electrode is electrically connected with the light-shielding metal layer pattern 2 through the first via-hole 24 and the third via-hole, and the signal line 6 is electrically connected with the photo-sensitive sensing element layer 3 through the second via-hole 25 and the fourth via-hole. As can be apparent from the description above, the compensation control TFT 5 above in the embodiments of the disclosure is a TFT with a top gate, but it shall be noted that the compensation control TFT 5 in the embodiments of the disclosure can alternatively be a TFT with a bottom gate, although the embodiments of the disclosure will not be limited thereto.

In some embodiments, as illustrated in FIG. 6, the method for fabricating the display substrate further includes: forming a passivation layer 13 on the compensation control TFT 5 and the signal line 6.

In some embodiments, the method for fabricating the display substrate further includes: forming an Indium Tin Oxide (ITO) layer 7 between the photo-sensitive sensing element layer 3 and the signal line 6, where the photo-sensitive sensing element layer 3 is electrically connected with the signal line 6 through the ITO layer 7. Further, the ITO layer 7 connecting the photo-sensitive sensing element layer 3 with the signal line 7 can be arranged in a number of implementations such as follows.

Figure 3:
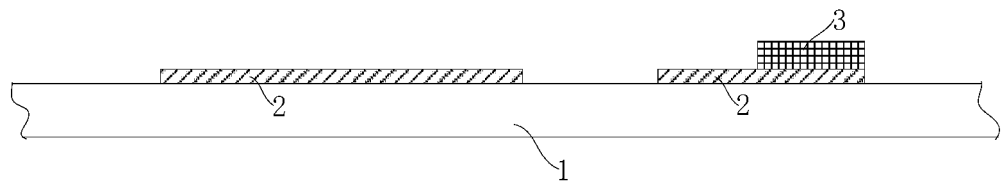

In a first implementation: as illustrated in FIG. 3, FIG. 4, and FIG. 5, after the P-type semiconductor layer in the photo-sensitive sensing element layer 3 is formed, and before the buffer layer 4 is formed, the ITO layer 7 is formed directly on the P-type semiconductor layer, and the signal line 6 is connected with the ITO layer 7 through the second via-hole 25 and the fourth via-hole.

Figure 8:
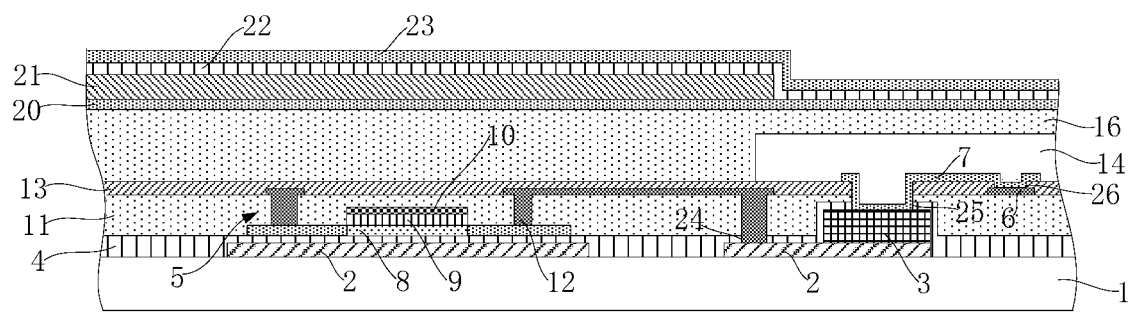
FIG. 8 is a schematic structural diagram of a display substrate according to the embodiments of the disclosure, which is an OLED display substrate in a bottom-emitting display panel.

In a second implementation: as illustrated in FIG. 8, after the passivation layer 13 is formed, and before the other layers are subsequently formed, the ITO layer 7 is formed on the passivation layer 13, where the passivation layer 13 includes a fifth via-hole corresponding to the fourth via-hole, and a sixth via-hole 26 for connecting the ITO layer 7 with the signal line 6, where the ITO layer 7 is connected with the P-type semiconductor layer through the second via-hole 25, the fourth via-hole, and the fifth via-hole; and the ITO layer 7 is connected with the signal line 6 through the sixth via-hole 26.

Figure 7:
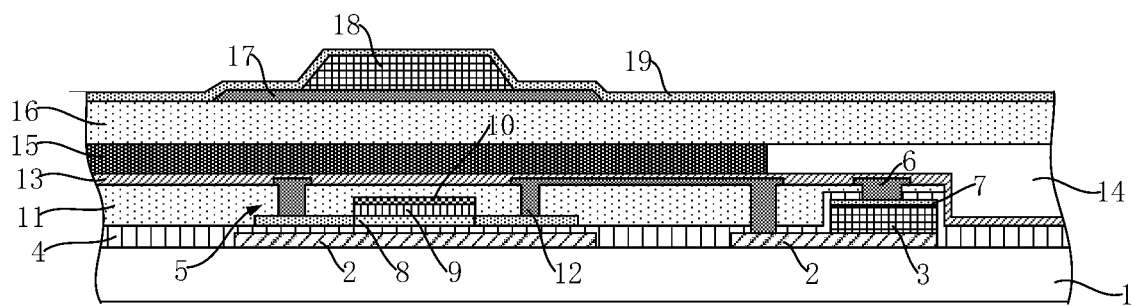
FIG. 7 is a schematic structural diagram of a display substrate according to the embodiments of the disclosure, which is an OLED display substrate in a top-emitting display panel.

In some embodiments, as illustrated in FIG. 7, the method for fabricating the display substrate further includes: forming a color filter layer 14 on the passivation layer 13, where the color filter layer 14 includes a plurality of sub-pixel layers corresponding to the sub-pixel areas in a one-to-one manner.

In some embodiments, the display substrate in the embodiments of the disclosure can be an OLED display substrate in a top-emitting display panel, or can be an OLED display substrate in a bottom-emitting display panel.

For example, when the display substrate is an OLED display substrate in a top-emitting display panel, as illustrated in FIG. 7, the fabricating method above can include: forming a black matrix 15 on the passivation layer 13, after the passivation layer 13 is formed and before the color filter layer 14 is formed on the passivation layer 13, where the black matrix covers the compensation control TFT 5 in a direction perpendicular to the base substrate 1; forming an insulation medium layer 16 on the color filter layer 14 after the color filter layer 14 is formed; forming a secondary cathode 17 on the insulation medium layer 16; forming a spacer layer 18 on the secondary cathode 17; and forming a transparent cathode layer 19 on the spacer layer 18.

In this case, the display substrate can be a color filter substrate (also be referred to as a color filter cover plate), and the color filter substrate can be encapsulated with a substrate with an OLED device and a TFT for driving the OLED device, to realize display. Of course, the display substrate can alternatively be directly formed with an OLED device and a TFT for driving the OLED device, which will not be limited hereto.

For another example, when the display substrate is an OLED display substrate in a bottom-emitting display panel, as illustrated in FIG. 8, the fabricating method above can include: forming an insulation medium layer 16 on the color filter layer 14; forming a transparent anode layer 20 on the insulation medium layer 16; forming a pixel definition layer 21 on the transparent anode layer 20 to define the sub-pixel areas; forming an electroluminescent layer 22 on the pixel definition layer 21; and forming a metal cathode layer 23 on the electroluminescent layer 22.

In this case, the display substrate can be further formed with a TFT for driving the OLED device (e.g. a TFT for driving the transparent anode layer 20, the electroluminescent layer 22, and the metal cathode layer 23, etc.). Of course, the TFT for driving the OLED device can alternatively be formed on a substrate opposite to the display substrate, and the display substrate can be encapsulated with the substrate with the TFT for driving the OLED device, to realize display, which will not be limited hereto.

As illustrated in FIG. 7 or FIG. 8, based upon the same inventive concept, the embodiments of the disclosure further provide a display substrate including a plurality of sub-pixel areas, where the display substrate further includes: a light-shielding metal layer pattern 2 on a base substrate 1, where an orthographic projection of the light-shielding metal layer pattern 2 onto the base substrate 1 partially overlaps with orthographic projections of the sub-pixels areas onto the base substrate 1; a photo-sensitive sensing element layer 3 on the light-shielding metal layer pattern 2, where an orthographic projection of the photo-sensitive sensing element layer 3 onto the base substrate 1 lies in an overlapping area of orthographic projections of the light-shielding metal layer pattern 2 and the sub-pixels areas onto the base substrate 1; a buffer layer 4 on the photo-sensitive sensing element layer 3; and a compensation control TFT 5 and a signal line 6 on the buffer layer 4, where a source electrode of the compensation control TFT 5 is electrically connected with the light-shielding metal layer pattern 2, and the signal line 6 is electrically connected with the photo-sensitive sensing element layer 3.

Since the display substrate addresses the problem under a similar principle to the method above, reference can be made to the implementation of the method above for an implementation of the display substrate, so a repeated description thereof will be omitted here.

Based upon the same inventive concept, the embodiments of the disclosure further provide a display device including the display substrate above according to the embodiments of the disclosure. Where the display device above according to the embodiments of the disclosure can be a mobile phone, an electronic book, a tablet computer, a TV set, a monitor, or any other product or component with a display function. And since the display device addresses the problem under a similar principle to the display substrate above, reference can be made to the implementation of the display substrate above for an implementation of the display device, so a repeated description thereof will be omitted here.

Evidently those skilled in the art can make various modifications and variations to the disclosure without departing from the spirit and scope of the disclosure. Thus the disclosure is also intended to encompass these modifications and variations thereto so long as the modifications and variations come into the scope of the claims appended to the disclosure and their equivalents.

The invention claimed is:

1. A display substrate, comprising a plurality of sub-pixel areas, wherein the display substrate further comprises:
   a light-shielding metal layer pattern on a base substrate, wherein an orthographic projection of the light-shielding metal layer pattern onto the base substrate partially overlaps with orthographic projections of the plurality of sub-pixel areas onto the base substrate;
   a photo-sensitive sensing element layer on the light-shielding metal layer pattern, wherein an orthographic projection of the photo-sensitive sensing element layer onto the base substrate lies in an overlapping area of orthographic projections of the light-shielding metal layer pattern and the plurality of sub-pixel areas onto the base substrate;

a buffer layer on the photo-sensitive sensing element layer; and a compensation control Thin Film Transistor (TFT) and a signal line on the buffer layer, wherein a source electrode of the compensation control TFT is electrically connected with the light-shielding metal layer pattern, and the signal line is electrically connected with the photo-sensitive sensing element layer.

2. The display substrate according to claim 1, wherein the photo-sensitive sensing element layer comprises an N-type semiconductor layer, an intrinsic semiconductor layer, and a P-type semiconductor layer on the light-shielding metal layer pattern in that order, wherein the P-type semiconductor layer is electrically connected with the signal line.

3. The display substrate according to claim 1, wherein the display substrate further comprises:

an Indium Tin Oxide (ITO) layer between the photo-sensitive sensing element layer and the signal line, wherein the photo-sensitive sensing element layer is electrically connected with the signal line through the ITO layer.

4. The display substrate according to claim 1, wherein the orthographic projection of the compensation control TFT onto the base substrate overlaps with a part of the orthographic projection of the light-shielding metal layer pattern onto the base substrate.

5. The display substrate according to claim 1, wherein the compensation control TFT comprises:

an active layer, a gate insulation layer, a gate layer, and source and drain electrodes on the buffer layer in that order;

wherein the display substrate further comprises:

an interlayer dielectric layer on the gate layer; wherein the source and drain electrodes, and the signal line are on the interlayer dielectric layer.

6. The display substrate according to claim 5, wherein the buffer layer comprises: a first via-hole for connecting the source electrode with the light-shielding metal layer pattern, and a second via-hole for connecting the signal line with the photo-sensitive sensing element layer;

the interlayer dielectric layer comprises: a third via-hole corresponding to the first via-hole, and a fourth via-hole corresponding to the second via-hole;

wherein the source electrode is electrically connected with the light-shielding metal layer pattern through the first via-hole and the third via-hole, and the signal line is electrically connected with the photo-sensitive sensing element layer through the second via-hole and the fourth via-hole.

7. The display substrate according to claim 1, wherein the display substrate further comprises:

a passivation layer on the compensation control TFT and the signal line; and a color filter layer on the passivation layer; wherein the color filter layer comprises a plurality of sub-pixel layers corresponding to the plurality of sub-pixel areas in a one-to-one manner.

8. The display substrate according to claim 7, wherein the display substrate further comprises:

a black matrix on the passivation layer; wherein the black matrix covers the compensation control TFT in a direction perpendicular to the base substrate;

an insulation medium layer on the color filter layer; and a secondary cathode, a spacer layer, and a transparent cathode layer on the insulation medium layer in that order.

9. The display substrate according to claim 7, wherein the display substrate further comprises:

an insulation medium layer on the color filter layer; and a transparent anode layer, a pixel definition layer, an electroluminescent layer, and a metal cathode layer on the insulation medium layer in that order; wherein the pixel definition layer is configured to define the plurality of sub-pixel areas.

10. A display device, comprising the display substrate according to claim 1.

11. A method for fabricating a display substrate comprising a plurality of sub-pixel areas, wherein the method comprises:

forming a metal layer on a base substrate, and patterning the metal layer to form a light-shielding metal layer pattern, wherein an orthographic projection of the light-shielding metal layer pattern onto the base substrate partially overlaps with orthographic projections of the plurality of sub-pixel areas onto the base substrate;

forming a photo-sensitive sensing element layer on the light-shielding metal layer pattern, wherein an orthographic projections of the photo-sensitive sensing element layer onto the base substrate lies in an overlapping area of orthographic projections of the light-shielding metal layer pattern, and the plurality of sub-pixel areas onto the base substrate;

forming a buffer layer on the photo-sensitive sensing element layer;

forming a compensation control Thin Film Transistor (TFT) and a signal line on the buffer layer, wherein a source electrode of the compensation control TFT is electrically connected with the light-shielding metal layer pattern, and the signal line is electrically connected with the photo-sensitive sensing element layer.

12. The method according to claim 11, wherein the photo-sensitive sensing element layer comprises an N-type semiconductor layer, an intrinsic semiconductor layer, and a P-type semiconductor layer on the light-shielding metal layer pattern in that order, wherein the P-type semiconductor layer is electrically connected with the signal line.

13. The method according to claim 11, wherein the method further comprises:

forming an Indium Tin Oxide (ITO) layer between the photo-sensitive sensing element layer and the signal line, wherein the photo-sensitive sensing element layer is electrically connected with the signal line through the ITO layer.

14. The method according to claim 11, wherein forming the ITO layer between the photo-sensitive sensing element layer and the signal line comprises:

forming the ITO layer on the P-type semiconductor layer, after the P-type semiconductor layer in the photo-sensitive sensing element layer is formed, and before the buffer layer is formed.

15. The method according to claim 11, wherein the orthographic projection of the compensation control TFT onto the base substrate overlaps with a part of the orthographic projection of the light-shielding metal layer pattern onto the base substrate.

16. The method according to claim 11, wherein forming the compensation control TFT and the signal line on the buffer layer comprises:

forming an active layer on the buffers layer;

forming a gate insulation layer on the active layer;

forming a gate layer on the gate insulation layer;

forming an interlayer dielectric layer on the gate layer;

depositing a source-drain metal on the interlayer dielectric layer, and patterning the source-drain metal to form source and drain electrodes, and the signal line.

17. The method according to claim 16, wherein the buffer layer comprises: a first via-hole for connecting the source electrode with the light-shielding metal layer pattern, and a second via-hole for connecting the signal line with the photo-sensitive sensing element layer;

the interlayer dielectric layer comprises: a third via-hole corresponding to the first via-hole, and a fourth via-hole corresponding to the second via-hole;

wherein the source electrode is electrically connected with the light-shielding metal layer pattern through the first via-hole and the third via-hole, and the signal line is electrically connected with the photo-sensitive sensing element layer through the second via-hole and the fourth via-hole.

18. The method according to claim 11, wherein the method further comprises:

forming a passivation layer on the compensation control TFT and the signal line; and forming a color filter layer on the passivation layer; wherein the color filter layer comprises a plurality of sub-pixel layers corresponding to the plurality of sub-pixel areas in a one-to-one manner.

19. The method according to claim 18, wherein the method further comprises:

forming a black matrix on the passivation layer, after the passivation layer is formed, and before the color filter layer is formed on the passivation layer, wherein the black matrix covers the compensation control TFT in a direction perpendicular to the base substrate;

forming an insulation medium layer on the color filter layer, after the color filter layer is formed;

forming a secondary cathode on the insulation medium layer;

forming a spacer layer on the secondary cathode; and forming a transparent cathode layer on the spacer layer.

20. The method according to claim 18, wherein the method further comprises:

forming an insulation medium layer on the color filter layer;

forming a transparent anode layer on the insulation medium layer;

forming a pixel definition layer on the transparent anode layer to define the plurality of sub-pixel areas;

forming an electroluminescent layer on the pixel definition layer; and forming a metal cathode layer on the electroluminescent layer.

* * * * *